United States Patent
Garner et al.

(10) Patent No.: US 11,184,996 B1
(45) Date of Patent: Nov. 23, 2021

(54) DOUBLE SIDED HEAT EXCHANGER COOLING UNIT

(71) Applicant: ADVANCED COOLING TECHNOLOGIES, INC., Lancaster, PA (US)

(72) Inventors: Scott D. Garner, Lititz, PA (US); Peter Dussinger, Lititz, PA (US); Jon Zuo, Lancaster, PA (US); Daniel T. Reist, Mountville, PA (US)

(73) Assignee: ADVANCED COOLING TECHNOLOGIES, INC., Lancaster, PA (US)

(*) Notice: Subject to any disclaimer, the term of this patent is extended or adjusted under 35 U.S.C. 154(b) by 178 days.

(21) Appl. No.: 16/684,878

(22) Filed: Nov. 15, 2019

Related U.S. Application Data

(63) Continuation of application No. 15/176,947, filed on Jun. 8, 2016, now Pat. No. 10,638,639.

(60) Provisional application No. 62/202,534, filed on Aug. 7, 2015.

(51) Int. Cl.
| | |
|---|---|
| *H05K 7/20* | (2006.01) |
| *F28F 21/08* | (2006.01) |
| *F28F 21/02* | (2006.01) |
| *F28D 15/02* | (2006.01) |
| *F28F 3/02* | (2006.01) |

(52) U.S. Cl.
CPC ..... *H05K 7/20154* (2013.01); *F28D 15/0266* (2013.01); *F28D 15/0275* (2013.01); *F28F 3/02* (2013.01); *F28F 21/02* (2013.01); *F28F 21/084* (2013.01); *F28F 21/085* (2013.01); *H05K 7/20336* (2013.01); *H05K 7/20409* (2013.01); *H05K 7/20518* (2013.01); *F28D 2015/0216* (2013.01); *F28F 2250/08* (2013.01)

(58) Field of Classification Search
CPC .......... H05K 7/20409; H05K 7/20518; H05K 7/20154; F28D 15/0266; F28D 15/0275; H01L 21/4882; H01L 21/487; H01L 23/367; H01L 23/3677; F28F 3/02
See application file for complete search history.

(56) References Cited

U.S. PATENT DOCUMENTS

| | | | |
|---|---|---|---|
| 8,196,645 B2* | 6/2012 | Lai | H01L 23/427 |
| | | | 165/104.33 |
| 2011/0228470 A1* | 9/2011 | Chang | G06F 1/20 |
| | | | 361/679.47 |

* cited by examiner

*Primary Examiner* — Gordon A Jones
(74) *Attorney, Agent, or Firm* — McNees Wallace & Nurick LLC

(57) ABSTRACT

A cooling unit positioned between a first and a second gas stream, the first and the second gas stream having no direct fluid contact therebetween. The cooling unit includes a double-sided heat exchanger with a first side that is in thermal communication with the first gas stream and a second side that is in thermal communication with the second gas stream. The double-sided heat exchanger provides a direct path of thermal conduction between the first gas stream and the second gas stream. First fins are provided on the first side of the double-sided heat exchanger and second fins are provided on the second side of the double-sided heat exchanger. A first surface area of the first side of the double-sided heat exchanger is at least 5% greater than a second surface area of the second side of the double-sided heat exchanger. A housing surrounds a fan and the second fins.

18 Claims, 6 Drawing Sheets

DOUBLE SIDED HEAT EXCHANGER COOLING UNIT

BACKGROUND OF THE INVENTION

Electrical enclosures are used to house and protect electronics equipment from potentially harmful environments such as high humidity or rain, condensation, solar heat loads, dust and debris, temperature extremes and damaging corrosion. In some cases, the cabinets must be sealed to a standard, typically by National Electrical Manufacturers Association (NEMA). For example, a NEMA 12 cabinet is for indoor use and protects against drips, dust and falling dirt. A NEMA 4 cabinet is for indoor or outdoor use and protects against the same things as NEMA 12 as well as hose directed spray. The sealed nature of these cabinets requires heat transfer from the inside space to the ambient environment while maintaining the NEMA rated seal.

For most electronic components in an enclosure, the suggested maximum allowable air temperature within the enclosure is in the range of 130° F. to 160° F. One common guideline states that for every 18° F. the temperature of an electronic component is elevated beyond its recommended operating temperature, the lifetime of the electronic components is cut in half. In order to increase electrical component lifetime and reduce process downtime due to component failure or replacement, a cooling solution must be chosen. If an enclosure must be sealed from the ambient environment, then a method of transferring heat through some cooling device must be chosen based on the amount of heat that needs to be removed and the ambient conditions around the enclosure.

In cases where the ambient air temperature is suitably low, an air-to-air heat exchanger 10, as shown diagrammatically in FIG. 1, can be used to transfer heat from the air 12 inside of the cabinet 14 to the ambient air 16. An air-to-air heat exchanger 10 transfers heat from the hot air 12 inside the enclosure 14 to the cooler ambient air 16 while maintaining a NEMA seal that prevents external air and other contaminants from entering the enclosure. It is beneficial to use a heat exchanger instead of an air conditioner (AC) when possible because the energy required to operate the cooling system is much lower.

Two key factors influencing the amount of heat that can be transferred from air inside of an enclosure to ambient air are the surface area available for heat transfer and the thermal resistance through the cooling device. Increasing the surface area of a heat exchanger by adding an extended surface or fin structure can increase heat transfer through the heat exchanger.

Lowering the thermal resistance between the internal enclosure air and the external ambient air reduces the difference between the two air temperatures that is necessary to transfer a given amount of heat. This means that with a lower thermal resistance, a lower internal enclosure temperature can be maintained for a given heat load into the enclosure. Air-to-liquid coolers are used for enclosures with high heat loads. These systems transfer heat to a liquid supply that may be a cooling water supply or a chilled liquid loop. In either case there is a requirement for additional equipment or a water supply that may not always be available.

Thermoelectric coolers are commonly used to achieve sub-ambient temperatures within an enclosure, but they are limited in capacity and are very expensive relative to other types of cooling products.

Air conditioners are also used to achieve sub-ambient cooling and are the most common active enclosure cooling product. The drawback to compressor-based cooling systems is that they require greater energy input than air-to-air heat exchangers.

When outside air cannot be introduced to the interior of an enclosure but the maximum temperature of the ambient environment and maximum heat load in the enclosure are suitable, a heat exchanger can be used to transfer heat out of the enclosure while maintaining a seal between the ambient environment and the interior of the enclosure. Heat exchanger products that are currently in use include heat pipe heat exchangers with aluminum finned coils, folded-fin heat exchangers, and plate & fin heat exchangers.

SUMMARY

An object of the invention is to provide a double-sided heat exchanger that has a direct path of thermal conduction between a first gas stream on one side of the double-sided heat exchanger and a second gas stream on the other side of the double-sided heat exchanger.

An object of the invention is to provide a heat exchanger with a lower thermal resistance by providing heat pipes in the heat exchanger. The heat pipes can be embedded between an internal side of a double-sided heat exchanger and the external side, so that heat can be transferred with little thermal resistance to the external side.

An object of the invention is to provide a heat exchanger in which embedded heat pipes ensure uniform temperature distribution across the heat exchanger, allowing for maximum heat transfer efficiency.

An object of the invention is to provide a heat exchanger in which embedded heat pipes may be used to transfer heat from an internal heat sink to an external heat sink that is larger in size. This adds heat transfer area at the exterior surface where heat must be dissipated to ambient air. If the heat transfer characteristics of the external heat sink are improved, then less air flow may be required to dissipate the heat.

An embodiment is directed to a cooling unit positioned between a first gas stream and a second gas stream, the first gas stream and the second gas stream having no direct fluid contact therebetween, the cooling unit including a double-sided heat exchanger having a first side having a first planar surface area, the first side with a first heat sink that is in thermal communication with the first gas stream, the first side facing the first gas stream, and a second side having a second planar surface area, the second side with a second heat sink that is in thermal communication with the second gas stream, the second side facing the second gas stream, the double-sided heat exchanger providing a direct path of thermal conduction between the first gas stream and the second gas stream, the first planar surface area of the first side of the double-sided heat exchanger is at least 25% greater than the second planar surface area of the second side of the double-sided heat exchanger. The cooling unit further includes the first heat sink including a first conductive plate and first fins, and the second heat sink including a second conductive plate and second fins, the first conductive plate having a length greater than a corresponding length of the second conductive plate. The cooling unit further includes heat pipes provided between the first conductive plate and the second conductive plate, the heat pipes extending along the length of the first conductive plate. The cooling unit further includes the first fins extending in a direction away from the first conductive plate of the first heat sink of the double-sided heat exchanger, and the second fins extending in a direction away from the second conductive plate of the second heat sink of the double-sided heat exchanger, the first fins and the second fins increase the heat transfer between the first gas stream and the second gas stream. The cooling unit further includes a fan surrounded by and directly connected to a housing surrounding the second fins and directly attached to the second conductive plate. The cooling unit further includes the double-sided heat exchanger is made from a thermally conductive material.

Another embodiment is directed to a cooling unit positioned between a first gas stream and a second gas stream, the first gas stream and the second gas stream having no direct fluid contact therebetween, the cooling unit including a double-sided heat exchanger having a first side having a first planar surface area, the first side with a first heat sink that is in thermal communication with the first gas stream, the first side facing the first gas stream, and a second side having a second planar surface area, the second side with a second heat sink that is in thermal communication with the second gas stream, the second side facing the second gas stream, the double-sided heat exchanger providing a direct path of thermal conduction between the first gas stream and the second gas stream, the first planar surface area of the first side of the double-sided heat exchanger is at least 25% greater than the second planar surface area of the second side of the double-sided heat exchanger. The cooling unit further includes the first heat sink comprising a first conductive plate and first fins, and the second heat sink comprising a second conductive plate and second fins, the first conductive plate having a length greater than a corresponding length of the second conductive plate. The cooling unit further includes the first fins extending in a direction away from the first conductive plate of the first heat sink of the double-sided heat exchanger, and the second fins extending in a direction away from the second conductive plate of the second heat sink of the double-sided heat exchange, the first fins and the second fins increase the heat transfer between the first gas stream and the second gas stream. The cooling unit further includes a fan surrounded by and directly connected to a housing surrounding the second fins and directly attached to the second conductive plate. The cooling unit further includes a high conductivity layer is provided between the first conductive plate of the first heat sink of the double-sided heat exchanger and the second conductive plate of the second heat sink of the double-sided heat exchanger, the high conductivity layer enhances the thermal conduction of the double-sided heat exchanger.

Other features and advantages of the present invention will be apparent from the following more detailed description, taken in conjunction with the accompanying drawings which illustrate, by way of example, the principles of the invention.

DETAILED DESCRIPTION OF THE INVENTION

Figure 1:
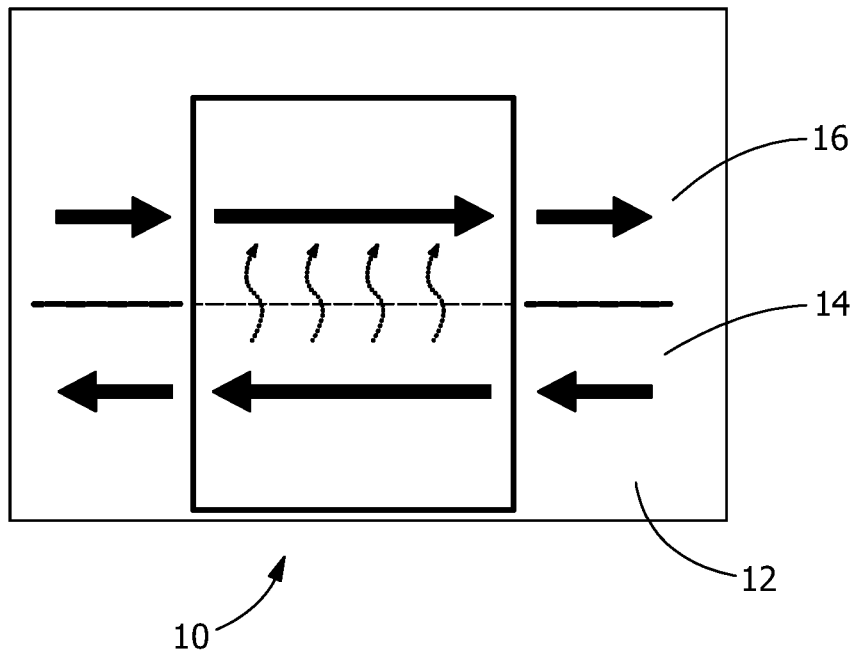
FIG. 1 is a generic air-to-air heat exchanger diagram of the prior art.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

Figure 9:
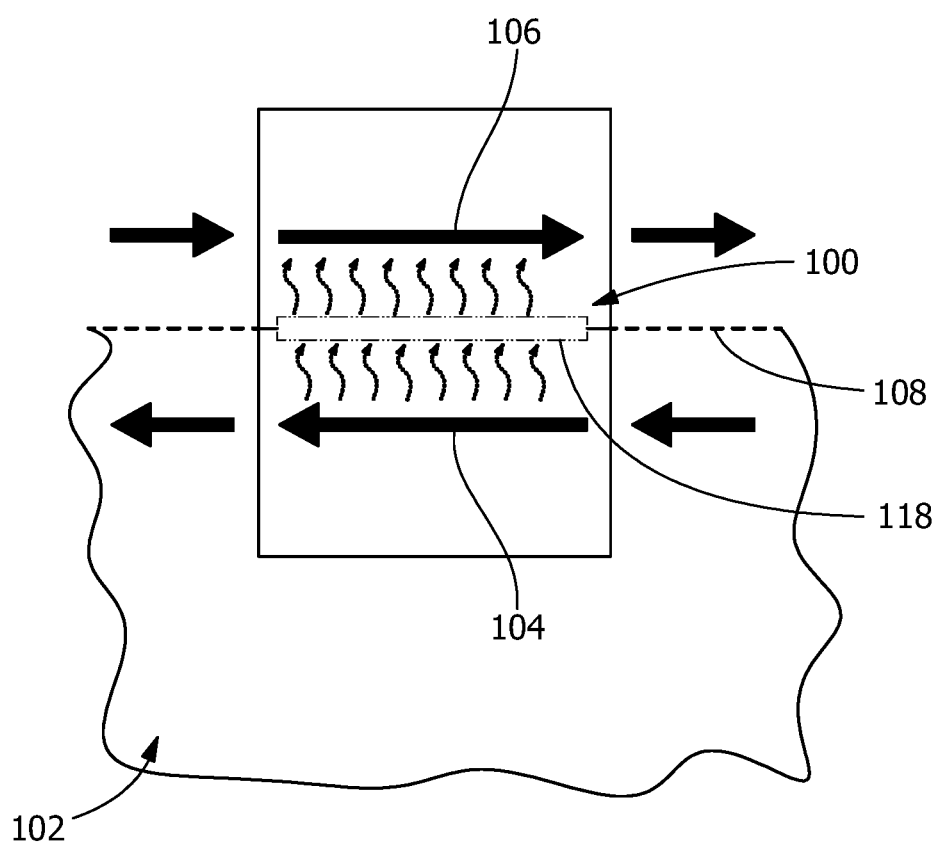
FIG. 9 is a diagrammatic view of an air-to-air heat exchanger according to the present invention.

In general, as represented diagrammatically in FIG. 9, an electrical enclosure or cabinet 102 includes a cooling unit with a double-sided heat exchanger 100 positioned between a first gas stream 104 and a second gas stream 106 is disclosed. The double-sided heat exchanger 100 provides a direct path of thermal conduction between the first gas stream 104 and the second gas stream 106.

Figure 3:
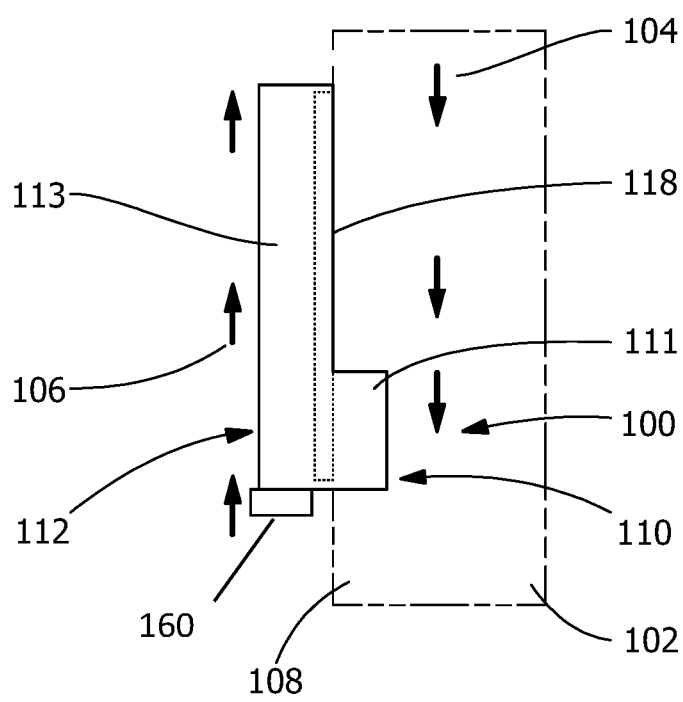
FIG. 3 is a diagrammatic side view of the heat exchanger of FIG. 2 positioned in a cabinet, with the cabinet shown in phantom to better illustrate the positioning of the heat exchanger.
Figure 2:
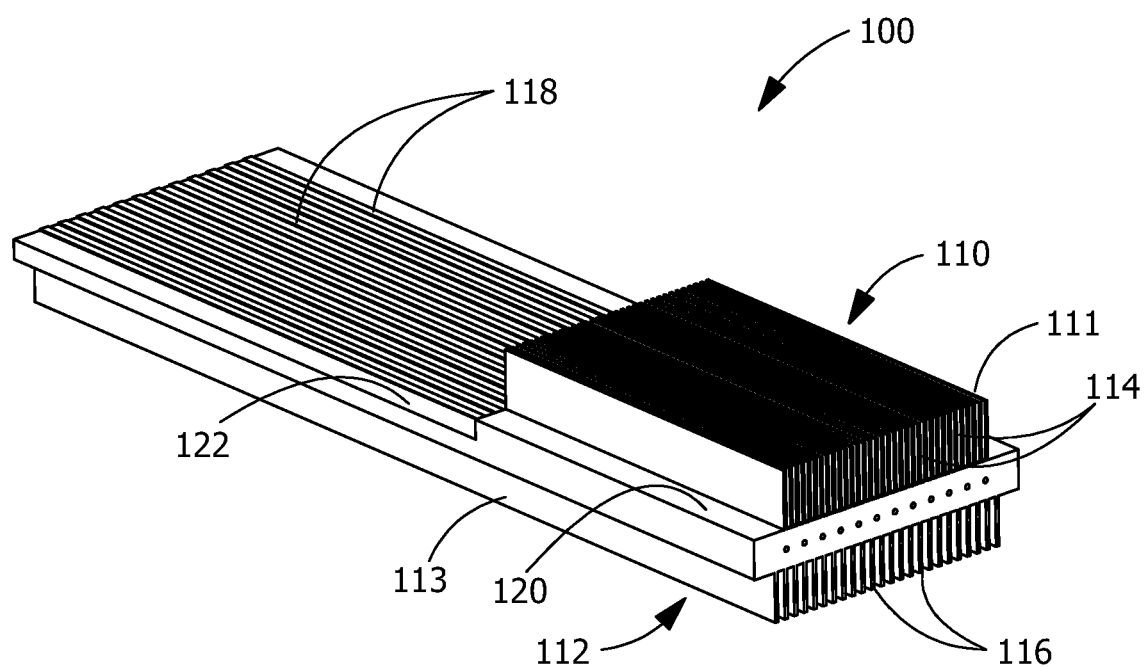
FIG. 2 is a top perspective view of an illustrative heat exchanger of the present invention for use in a cabinet.

Referring to FIG. 3, a double-sided heat exchanger 100 positioned in an electrical enclosure 102. The heat exchanger 100 is positioned between a first gas stream 104 provided inside the enclosure 102 and a second gas stream 106 positioned outside the enclosure 102. The first gas stream 104 and the second gas stream 106 have no direct fluid contact therebetween. The double-sided heat exchanger 100 is positioned in a wall 108 of the enclosure 102 with a first side 110 with a first heat sink 111 in thermal communication with the first gas stream 104 and a second side 112 with a second heat sink 113 in thermal communication with the second gas stream 106. The double-sided heat exchanger 100 provides a direct path of thermal conduction between the first gas stream 104 and the second gas stream 106. In the embodiment shown in FIG. 2, the cooling unit has first fins 114 provided on the first heat sink 111 of the first side 110 of the double-sided heat exchanger 110 and second fins 116 provided on the second heat sink 113 of the second side 112 of the double-sided heat exchanger 100. Referring to FIG. 2, the fins 114, 116 increase the heat transfer between the first gas stream 104 and the second gas stream 106. However, other embodiments of the heat exchanger, which are not shown, may have fins only on one heat sink, or may have no fins on either heat sink. The double-sided heat exchanger 100 is made from a thermally conductive material. The thermally conductive material may include, but is not limited to, aluminum, aluminum alloy, copper, copper alloy or stainless steel.

Embedded heat pipes 118 are provided between the first heat sink 111 and the second heat sink 113. The heat pipes 118 extend essentially the entire length or width of either the first heat sink 111 or the second heat sink 113, whichever is longer.

In the embodiment shown, the second gas stream 106 is a colder fluid stream located outside of an enclosure 102 which houses the double-sided heat exchanger 100, and the first gas stream 104 is a warmer fluid stream located inside of the enclosure 102 which houses the double-sided heat exchanger 100. In various embodiments, a surface area of the second side 112 of the double-sided heat exchanger 100 is larger than the surface area of the first side 110 of the double-sided heat exchanger 100. The surface area of the second side 112 may be 5% greater, 10% greater, 15% greater, 20% greater, 25% greater or greater than 25% greater than the surface area of the first side 110. In addition, the surface area of the second fins 116 may be 5% greater, 10% greater, 15% greater, 20% greater, 25% greater or greater than 25% greater than the surface area of the first fins 114. In various embodiments, the second fins 116 of the second side 112 are spaced apart by a distance which is greater than a distance by which the first fins 114 of the first side 110 are spaced apart, therein facilitating thermal conduction to occur by natural convection. The second fins 116 may be spaced apart by 5% greater, 10% greater, 15% greater, 20% greater, 25% greater or greater than 25% greater than the first fins 114. In addition, the second fins 116 may be thicker than the first fins 114.

Figure 6:
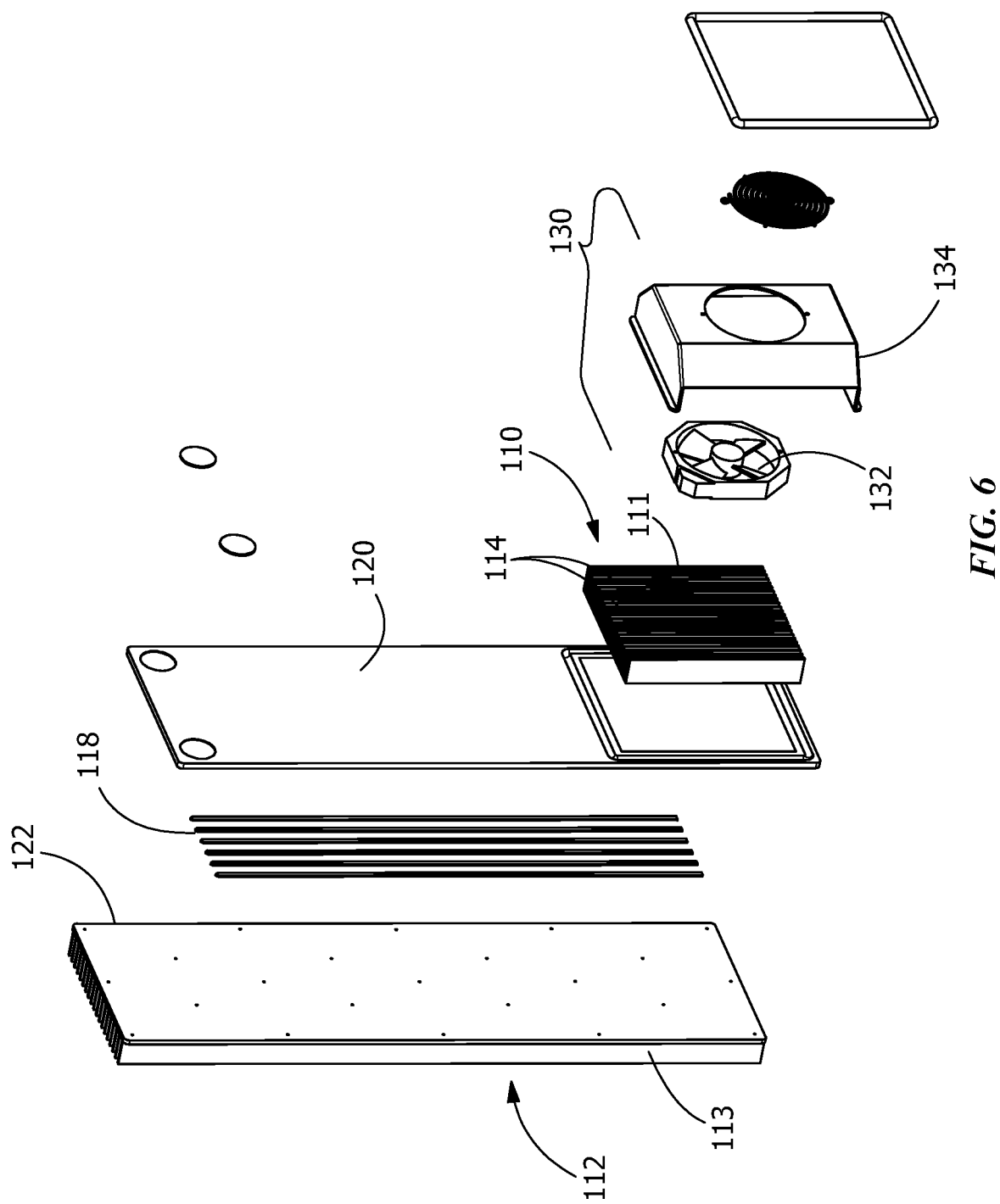
FIG. 6 is an exploded perspective view of the heat exchanger of FIG. 4.

As best shown in FIG. 6, heat pipes 118 are embedded between a highly conductive layer or plate 120 and a highly conductive layer or plate 122. The highly conductive layers or plates 120, 122 may be made from, but are not limited to, aluminum, aluminum alloys, copper or copper alloys. Alternatively, the plates may be integrally molded with or extruded in the heat sinks 111, 113.

Heat pipes 118 may be replaced by a highly conductive layer positioned between the plates 120, 122. The highly conductive layer may be made from, but not limited to, pyrolytic graphite, diamond and graphite fiber reinforced composite.

Figure 4:
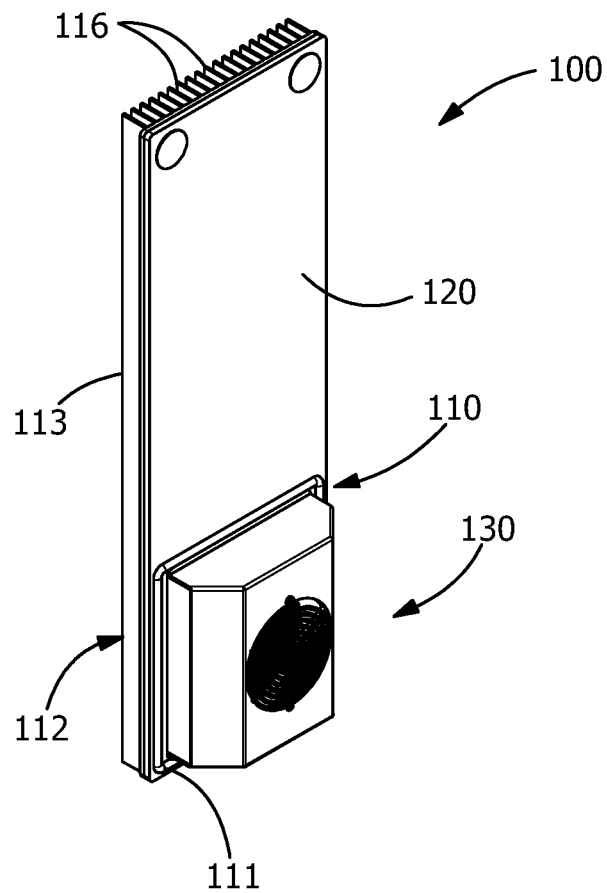
FIG. 4 is a front perspective view of an alternate illustrative heat exchanger of the present invention for use in a cabinet, the heat exchanger having a fan provided thereon.
Figure 5:
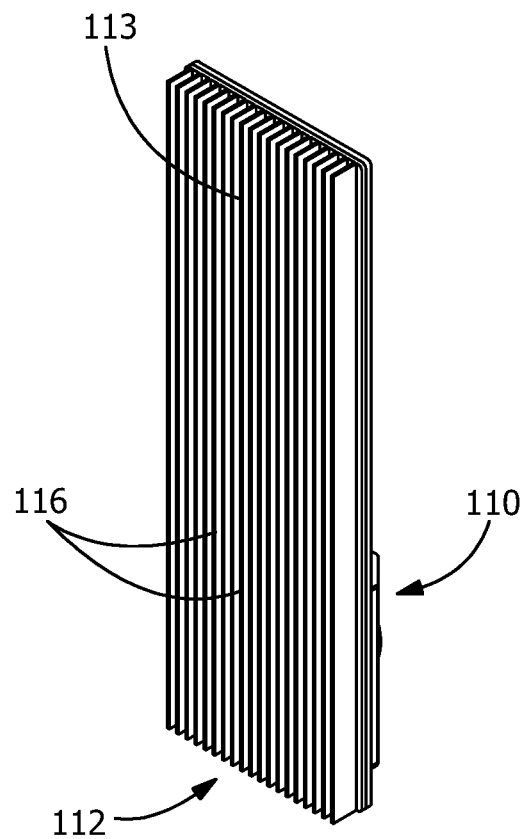
FIG. 5 is a back perspective view of the heat exchanger of FIG. 4.

In the embodiment shown in FIGS. 2 and 3, the plate 122 extends the length of the heat sink 113 and the plate 120 extends the length of the heat sink 111, thereby allowing portions of the heat pipes 118 to be exposed. In contrast, plates 120 and 122 of FIGS. 4 through 6 are similar in length, thereby covering the entire length of the heat pipes 118. The plates 120, 122 and heat pipes 118 are placed in good thermal contact with the heat sinks 111, 113 to facilitate the heat transfer between the first gas stream 104 and the second gas stream 106. The heat pipes 118 are used to facilitate the movement of heat from the heat input zone and spread heat throughout the entire heat exchanger 100 while delivering it to the heat output zone.

In various embodiments, a longitudinal axis of the one or more heat pipes 118 is parallel with a longitudinal axis of the first fins 114 and the second fins 116. In other embodiments, the longitudinal axis of the one or more heat pipes 118 is perpendicular with the longitudinal axis of the first fins 114 and/or the second fins 116.

One or more variable conductance heat pipes can be used in place of traditional heat pipes to allow the thermal resistance of the entire heat exchanger 100 to be increased when the temperature local to the heat output zone is reduced (such as in a low temperature ambient condition).

Figure 7:
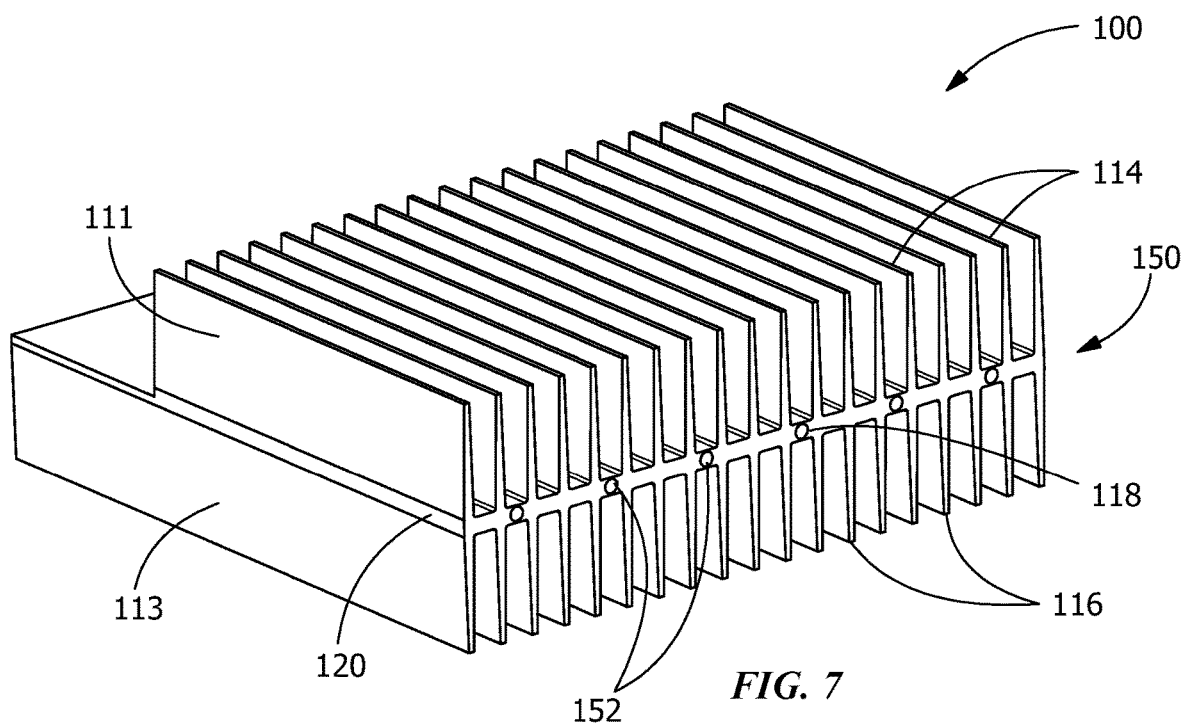
FIG. 7 is a portion of a representative heat exchanger formed as a single block, the heat exchanger having openings for heat pipes.
Figure 8:
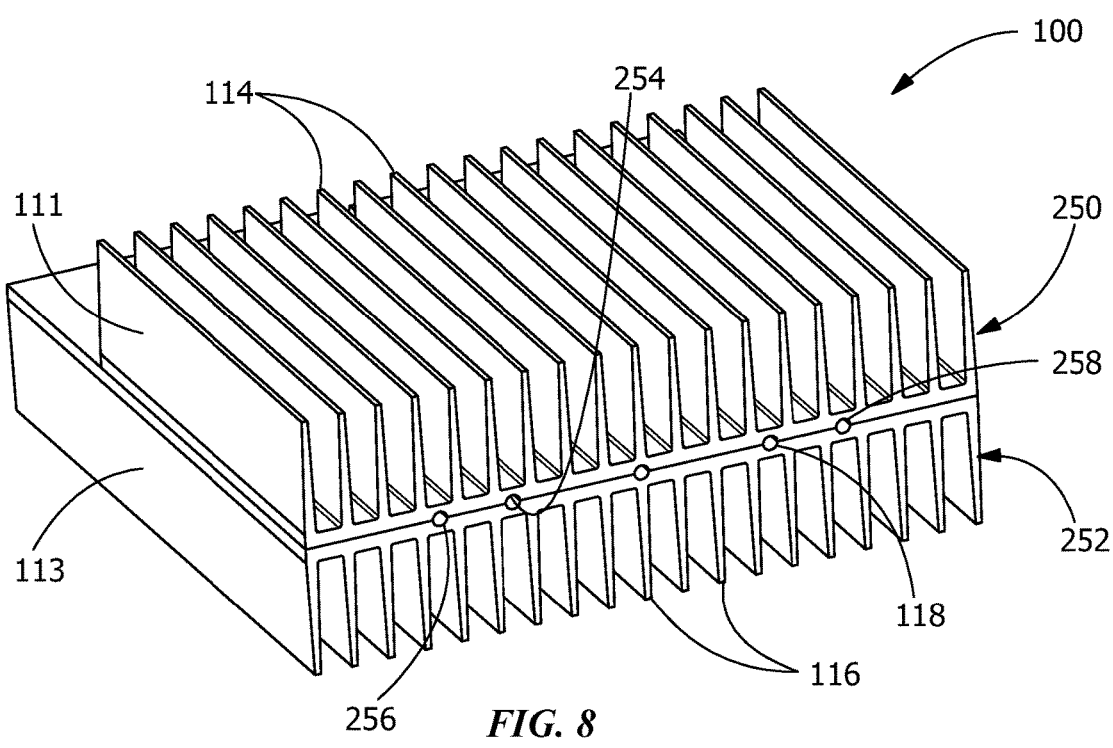
FIG. 8 is a portion of a representative heat exchanger formed from two blocks which are joined together, the heat exchanger having openings for heat pipes formed by the two blocks.

The width of the heat sinks 111, 113 may be essentially identical (as shown in FIGS. 7 and 8) or they may vary (as shown in FIGS. 2 through 6), with the heat sink 113 on one side 112 of the double-sided heat exchanger 100 larger than the heat sink 111 on the other side 110. In the case where the two sides of the double-sided heat exchanger 100 are symmetric, the heat pipes may not be needed. In the case where one side of the double-sided heat exchanger 100 is larger, the heat pipes 118 will extend the length of the larger heat sink 113 in order to spread heat to the entire surface of the larger heat sink 113. A larger heat sink 113 positioned outside of the enclosure 102 is useful for situations that require natural convection heat dissipation on the heat output side.

As best shown in FIGS. 4 and 6, fan assemblies 130 with one or more fans 132 enclosed therein can be mounted on the heat sinks 111. In addition, fan assemblies (not shown) may also be mounted on heat sinks 113. The fan 132 facilitates the movement of air through the fins to allow heat to be dissipated by forced convection. In the embodiment shown in FIGS. 4 through 6, only the heat sink 111 has an internal fan assembly 130 provided thereon. This forces hot air from the first gas stream 104 of the enclosure 102 over the fins 114 of the heat sink 111, cooling the air. Depending on the application, one or more external fans may also be mounted on the heat sink 113 to facilitate the cooling of the heat sink 113. Both internal fans and external fans can be turned off or not operated when natural convention is sufficient to dissipate the heat.

In FIG. 6, the fan 132 is mounted in an impingement configuration so that air is drawn into the center of the fins 114 and exhausted from each end. The fan assembly 130 may include a shroud 134 or ductwork that directs air flow in a manner that enhances heat transfer. Other embodiments of the fan assembly 130 and fan 132 may be used without departing from the scope of the invention. For example, a low power fan may be used to enhance natural convection heat transfer on one side.

Referring to FIG. 7, an alternate embodiment is shown. In this embodiment, the double-sided heat exchanger 100 is formed as a single member or block 150, with the first fins 114 of the first heat sink 111 and the second fins 116 of the second heat sink 113 formed therein. One or more openings 152 extend through an integral layer or plate 120 formed between the first fins 114 and the second fins 116. The openings 152 are dimensioned to receive heat pipes 118 therein. The heat pipes 118 are used to move heat from the heat input zone and spread heat throughout the entire heat exchanger 100 while delivering it to the heat output zone.

Referring to FIG. 8, another alternate embodiment is shown. In this embodiment, the double-sided heat exchanger 100 is formed from two members or blocks 250, 252, with the first fins 114 of the first heat sink 111 formed in the first block 250 and the second fins 116 of the second heat sink 113 formed in the second block 252. Rounded surfaces 254, 256 are formed on mating sides of the respective blocks 250, 252. The rounded surfaces form one or more openings 258 when the blocks 250, 252 are mated or joined together. The openings 258 are dimensioned to receive heat pipes 118 therein. The heat pipes 118 are used to move heat from the heat input zone and spread heat throughout the entire heat exchanger 100 while delivering it to the heat output zone.

The double-sided heat sink exchanger and the enclosure described herein are able to be produced at lower cost than other types of coolers such as heat pipe heat exchangers or thermoelectric coolers.

While the invention has been described with reference to a preferred embodiment, it will be understood by those skilled in the art that various changes may be made and equivalents may be substituted for elements thereof without departing from the spirit and scope of the invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. One skilled in the art will appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A cooling unit positioned between a first gas stream and a second gas stream, the first gas stream and the second gas stream having no direct fluid contact therebetween, the cooling unit comprising:
   a double-sided heat exchanger having a first side having a first planar surface area, the first side with a first heat sink that is in thermal communication with the first gas stream, the first side facing the first gas stream, and a second side having a second planar surface area, the second side with a second heat sink that is in thermal communication with the second gas stream, the second side facing the second gas stream, the double-sided heat exchanger providing a direct path of thermal conduction between the first gas stream and the second gas stream, the first planar surface area of the first side of the double-sided heat exchanger is at least 25% greater than the second planar surface area of the second side of the double-sided heat exchanger;
   the first heat sink comprising a first conductive plate and first fins, and the second heat sink comprising a second conductive plate and second fins;
   heat pipes provided between the first conductive plate and the second conductive plate, the heat pipes extending along the length of the first conductive plate;
   the first fins extending in a direction away from the first conductive plate of the first heat sink of the double-sided heat exchanger, and the second fins extending in a direction away from the second conductive plate of the second heat sink of the double-sided heat exchanger, the first fins and the second fins increase the heat transfer between the first gas stream and the second gas stream;
   a fan surrounded by and directly connected to a housing surrounding the second fins and directly attached to the second conductive plate;
   the double-sided heat exchanger is made from a thermally conductive material.

2. The cooling unit as recited in claim 1, wherein a first fin surface area of the first fins of the first side of the double-sided heat exchanger is at least 5% greater than a second fin surface area of the second fins of the second side of the double-sided heat exchanger.

3. The cooling unit as recited in claim 1, wherein the thermally conductive material is aluminum, aluminum alloy, copper, copper alloy or stainless steel.

4. The cooling unit as recited in claim 1, wherein at least one heat pipe of the heat pipes has a length having a longitudinal axis parallel with a longitudinal axis of the first fins and the second fins.

5. The cooling unit as recited in claim 1, wherein a longitudinal axis of at least one heat pipe of the heat pipes is perpendicular with a longitudinal axis of the first fins and the second fins.

6. The cooling unit as recited in claim 1, wherein the first gas stream is a colder fluid stream located outside of an enclosure which houses the double-sided heat exchanger and the second gas stream is a warmer fluid stream located inside of the enclosure which houses the double-sided heat exchanger.

7. The cooling unit as recited in claim 6, wherein at least one heat pipe of the heat pipes is a variable conductance heat pipe embedded in the double-sided heat exchanger to reduce the heat transfer when the temperature of the first gas stream drops.

8. The cooling unit as recited in claim 1, wherein the first gas stream is a colder fluid stream located outside of an enclosure which houses the double-sided heat exchanger and the second gas stream is a warmer fluid stream located inside of the enclosure which houses the double-sided heat exchanger, the first fins are spaced apart by a first distance which is at least 10% greater than a second distance by which the second fins are spaced apart, therein allowing the heat transfer to occur by natural convection.

9. The cooling unit as recited in claim 1, wherein the external fan is turned off when natural convection is sufficient to dissipate the heat.

10. A cooling unit positioned between a first gas stream and a second gas stream, the first gas stream and the second gas stream having no direct fluid contact therebetween, the cooling unit comprising:
   a double-sided heat exchanger having a first side having a first planar surface area, the first side with a first heat sink that is in thermal communication with the first gas stream, the first side facing the first gas stream, and a second side having a second planar surface area, the second side with a second heat sink that is in thermal communication with the second gas stream, the second side facing the second gas stream, the double-sided heat exchanger providing a direct path of thermal conduction between the first gas stream and the second gas stream, the first planar surface area of the first side of the double-sided heat exchanger is at least 25% greater than the second planar surface area of the second side of the double-sided heat exchanger;
   the first heat sink comprising a first conductive plate and first fins, and the second heat sink comprising a second conductive plate and second fins;
   the first fins extending in a direction away from the first conductive plate of the first heat sink of the double-sided heat exchanger, and the second fins extending in a direction away from the second conductive plate of the second heat sink of the double-sided heat exchange, the first fins and the second fins increase the heat transfer between the first gas stream and the second gas stream;

a fan surrounded by and directly connected to a housing surrounding the second fins and directly attached to the second conductive plate;

a high conductivity layer is provided between the first conductive plate of the first heat sink of the double-sided heat exchanger and the second conductive plate of the second heat sink of the double-sided heat exchanger, the high conductivity layer enhances the thermal conduction of the double-sided heat exchanger.

11. The cooling unit as recited in claim 10, wherein the double-sided heat exchanger is made from a thermally conductive material, the thermally conductive material is aluminum, aluminum alloy, copper, copper alloy or stainless steel.

12. The cooling unit as recited in claim 10, wherein the high conductivity layer is made from pyrolytic graphite, diamond or graphite fiber reinforced composite.

13. The cooling unit as recited in claim 10, wherein the high conductivity layer includes one or more heat pipes.

14. The cooling unit as recited in claim 13, wherein the one or more heat pipes has a length having a longitudinal axis parallel with a longitudinal axis of the first fins and the second fins.

15. The cooling unit as recited in claim 13, wherein a longitudinal axis of the one or more heat pipes is perpendicular with a longitudinal axis of the first fins and the second fins.

16. The cooling unit as recited in claim 10, wherein the first gas stream is a colder fluid stream located outside of an enclosure which houses the double-sided heat exchanger and the second gas stream is a warmer fluid stream located inside of the enclosure which houses the double-sided heat exchanger.

17. The cooling unit as recited in claim 16, wherein the high conductivity layer is made of one or more variable conductance heat pipes embedded in the double-sided heat exchanger to reduce the heat transfer when the temperature of the first gas stream drops.

18. The cooling unit as recited in claim 16, wherein the first fins are spaced apart by a first distance which is at least 10% greater than a second distance by which the second fins are spaced apart, therein allowing the heat transfer to occur by natural convection.

* * * * *